United States Patent [19]

Kimura et al.

[11] Patent Number: 5,293,502

[45] Date of Patent: Mar. 8, 1994

[54] INTEGRATED CIRCUIT PACKAGE

[75] Inventors: Yukihiro Kimura; Nobuhiko Miyawaki; Masao Kuroda, all of Aichi, Japan

[73] Assignee: NGK Spark Plug Co., Ltd., Aichi, Japan

[21] Appl. No.: 868,567

[22] Filed: Apr. 15, 1992

[30] Foreign Application Priority Data

Apr. 16, 1991 [JP] Japan ................................. 3-83860

[51] Int. Cl.⁵ ............................................. H05K 01/00
[52] U.S. Cl. .................................. 174/250; 174/250;
174/262; 174/265; 174/267; 361/785
[58] Field of Search ............... 174/262, 263, 264, 265,
174/266, 260, 250, 267; 361/483, 412, 413, 414, 424

[56] References Cited

U.S. PATENT DOCUMENTS 4,791,722  12/1988  Miller, Jr.
5,073,684  12/1991  Miyabayashi .................. 174/260

OTHER PUBLICATIONS

N. Goldberg, "Design of Thin Film Multichip Modules," The International Journal For Hybrid Microelectronics, vol. 4, Oct. 1981, pp. 289-293.

Y. Noguchi et al, "Analysis of Characteristics of the Shielded-Coplanar Waveguide by Conformal Mapping Method," Journal of Electro Communication Society, vol. J60-B, No. 8, 1977, pp. 561-566.

T. Sekiguchi et al, "A Multi-Chip Packaged GaAs 16 x 16 Bit Parallel Multiplier," Optoelectronics Laboratories, pp. 1-4.

Primary Examiner—Leo P. Picard
Assistant Examiner—Cheryl R. Figlin
Attorney, Agent, or Firm—Finnegan, Henderson, Farabow Garrett & Dunner

[57] ABSTRACT

The present integrated circuit package provides both a high density of conductor poles, and reduced crosstalk noises between the conductor poles. The conductor poles are received within holes in an insulating substrate. The insulating substrate has a laminated, multi-layer ceramic substrate structure comprising insulating plates having metallized layers thereon which constitute a portion of the walls of the holes. In addition, insulating layers for insulating the metallized layers from the conductor poles are formed within a selected number of the holes.

16 Claims, 2 Drawing Sheets

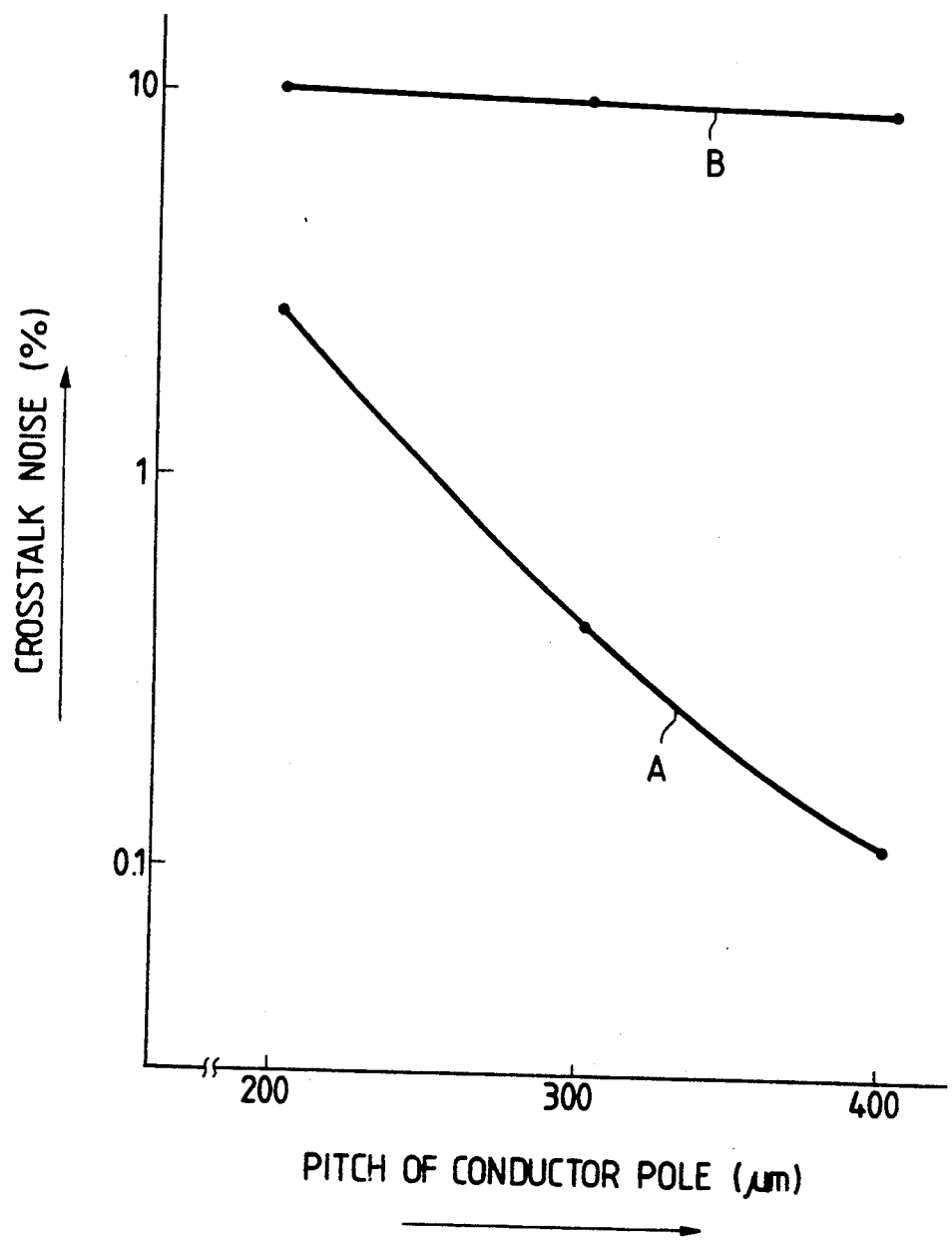

INTEGRATED CIRCUIT PACKAGE

BACKGROUND OF THE INVENTION

1. Field of the Invention

The present invention relates to an integrated circuit package comprising an insulating substrate for receiving a number of conductor poles that pass signal, power, and ground from an integrated circuit mounted on the integrated circuit package.

2. Discussion of the Related Art

Recently, there has been a demand in the field of integrated circuit packaging to reduce the pitch of the conductor poles received in the insulating substrates of integrated circuit packages in order to increase the speed and density, and decrease the size, of the integrated circuits that are mounted on integrated circuit packages.

The art has not been able to overcome two fundamental problems that occur when the pitch of the conductor poles becomes narrow. First, crosstalk noise becomes significantly high, between the conductor poles. Accordingly, the art has failed to reach the desired density of the conductor poles and also reduce crosstalk noise. A second problem is that the characteristic impedance of the conductor poles is scattered which causes signal reflection noise and deteriorates signal transmission characteristics.

SUMMARY OF THE INVENTION

The present invention has been made in view of the above circumstances and has as an object to provide an integrated circuit package having a high density of conductor poles.

A further object of the present invention is to provide an integrated circuit package having a high density of conductor poles, and reduced crosstalk noise between the conductor poles.

A still further object of the present invention is to provide an integrated circuit package having a high density of conductor poles, which have impedance matching.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects in accordance with the purpose of the invention, as embodied and broadly described herein, the integrated circuit package comprises an insulating substrate having a laminated structure defining holes for receiving conductor poles, metallized layers for shielding the conductor poles, the metallized layers comprising a portion of the surface of each insulating plates, and insulating layers for insulating the metallized layers from the conductor poles, the insulating layers being located intermediate the metallized layers and the conductor poles.

The present invention further comprises a method for manufacturing an integrated circuit package comprising the steps of providing an insulating substrate having a laminated structure defining holes for receiving conductor poles, forming metallized layers for shielding the conductor poles, the metallized layers comprising a portion of the surface of each insulating plates, and forming insulating layers for insulating the metallized layers from the conductor poles, the insulating layers being located intermediate the metallized layers and the conductor poles.

BRIEF DESCRIPTION OF THE DRAWINGS

The accompanying drawings, which are incorporated in and constitute a part of the specification, illustrate an embodiment of the invention and, together with the description, serve to explain the objects, advantages and principles of the invention. In the drawings;

FIG. 3 is a graphical illustration of the relationship between the pitch of the conductor poles and crosstalk noise for a prior art integrated circuit package and the integrated circuit package according to the present invention.

DETAILED DESCRIPTION OF THE PREFERRED EMBODIMENTS

The integrated circuit package according to the present invention comprises an insulating substrate having a laminated structure defining holes for receiving conductor poles. Metallized layers for shielding the conductor poles are formed to constitute a portion of the surface of each insulting plates. Insulating layers for insulating the metallized layers from the conductor poles are formed intermediate the conductor poles and the metallized layers.

In the integrated circuit package according to the present invention, the insulating layers are formed only on the circumferential surfaces of the conductor poles. The insulating layers are formed intermediate to the metallized layers that are disposed adjacent to the peripheries of the conductor poles and in contact with the insulating layers. Consequently, each conductor pole has a quasi-coaxial structure, with the metallized layers providing a ground shielding. The quasi-coaxial structure reduces the crosstalk noise between the conductor poles in comparison with the prior art integrated circuit packages. This effect is provided even when the pitch of the conductor poles is made narrow to increase their density. Further, because each conductor pole has a quasi-coaxial structure, the present integrated circuit package provides characteristic impedance matching of the conductor poles, reduced signal reflection noise and improved signal transmission characteristics. Still further, the present integrated circuit package provides a shielding effect even when the conductor poles are used for power line.

A preferred embodiment of an integrated circuit package according to the present invention will be described with reference to the drawings.

Figure 1:
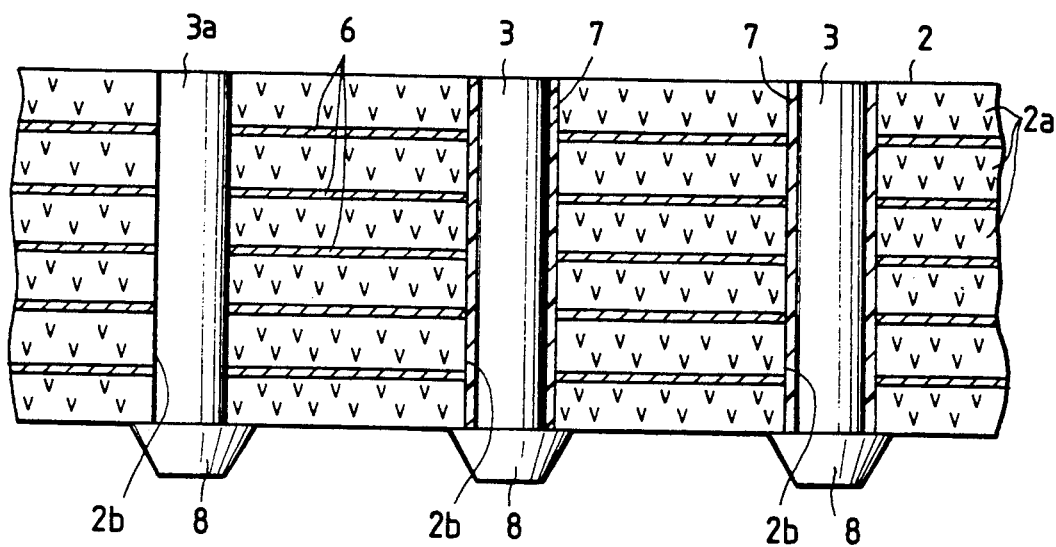
FIG. 1 is a cross-sectional view of a main portion of an embodiment of the integrated circuit package according to the present invention.
Figure 2:
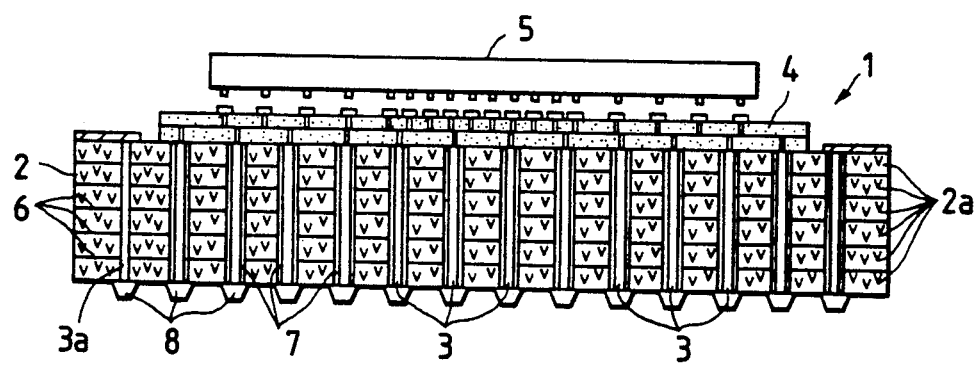
FIG. 2 is a schematic view of an embodiment of the integrated circuit package according to the present invention.

FIG. 1 depicts a cross-sectional view of a main portion of an embodiment of the present integrated circuit package, and FIG. 2 depicts a schematic view. The integrated circuit package 1 comprises an insulating substrate 2 composed of ceramics for receiving a number of conductor poles 3. Two or three layers of wiring (not shown) for leading signals are formed on one side of the integrated circuit package 1 through a polyimide layer 4. A flip chip 5 integrated circuit is mounted on a surface of the polyimide layer 4. After the flip chip 5 has been mounted, a sealing cap (not shown) is fixed on the circumference of the insulating substrate 2 to seal the flip chip 5. In a further embodiment of the present invention, an integrated circuit is mounted by TAB or wire bonding.

The insulating substrate 2 has a laminated, multi-layer ceramic substrate structure comprised of a number of thin insulating plates 2a. The insulating plates are composed of sintered AlN, $Al_2O_3$, mullite, glass ceramic, crystallized glass, $Si_3N_4$, or like ceramic materials. A metallized layer is formed over substantially an entire surface of each insulating plate 2a, producing an insulating substrate having a number of metallized layers. In addition, insulating layers 7 for insulating the metallized layers 6 from the conductor poles 3 are formed to constitute a portion of the wall of each hole 2b of the insulating substrate 2 which receives a conductor pole 3. A bump 8, formed on an end portion of each conductor pole 3 by a conventional process, is connected electrically to an electrode on a mother board. In a further embodiment of the present invention, instead of providing the bump 8 on an insulating substrate, the present invention may be applied to a PGA package having pins.

As depicted in FIG. 1, an insulating layer 7 is not formed on the left-most conductor pole 3a. Accordingly, each metallized layer 6 is connected electrically to the conductor pole 3a, which is connected to ground.

To produce the insulating substrate 2, first, a thin plate-like green sheet, which will become an insulating plate 2a, is formed of AlN, $Al_2O_3$, mullite, glass ceramic, crystallized glass, $Si_3N_4$, or a like ceramic material. Next, substantially an entire surface of the green sheet is coated with conductive paste to form a metallized layer 6. Metals having a lower melting temperature such as Au, Ag, Cu, or the like, may be used with low-temperature sintering ceramics such as glass ceramic, crystallized glass, or the like. This process is repeated for a number of green sheets. The coated green sheets are then laminated, cut into a predetermined shape, and sintered in a furnace to obtain the insulating substrate 2 having a multi-layer structure.

A number of through holes 2b, each having an inner diameter of from about 0.1 mm to about 0.2 mm, are then formed in the sintered insulating substrate 2 by a laser, or like process. In a further embodiment of the present invention, the holes 2b may be formed in the insulating substrate 2 by a drilling or punching process prior to sintering. The distance between the adjacent holes 2b is made very narrow, preferably from about 0.20 mm to about 0.40 mm.

The insulating layers 7 are then formed on the walls of the holes 2b of the insulating substrate 2. The insulating layers 7 are composed of polyimide, glass paste, chemical vapor deposited (CVD) $SiO_2$ film, or the like, and have a thickness of from about 2 $\mu m$ to about 20 $\mu m$. Finally, the conductor poles 3 are formed by filling the holes 2b with a metal such as Al, Cu, Ag, or the like, by sputtering, plating, metal casting, or the like. In a further embodiment of the present invention, the conductor poles 3 may be formed as separate pin members which are coated with an insulating layer, inserted into a selected number of the holes 2b in the insulating substrate 2, and then cured or baked.

The relationship between the crosstalk noise and the pitch of the conductor poles is graphically illustrated in FIG. 3. The data was measured for integrated circuit packages having an insulating substrate thickness of 1.2 mm. Line A represents the measured data for the present integrated circuit package which comprises an insulating substrate having an eight-layered laminated structure, with each sheet being coated with a metallized layer. Line B represents the measured data for a prior art integrated circuit package in which the pitch of the conductor poles in the insulating substrate was made narrow without using shielding. The data was measured by a TRD method.

As evident from the two plots in FIG. 3, crosstalk noise is greatly reduced in the integrated circuit package that uses shielding according to the present invention, in comparison to the prior art integrated circuit package that lacks shielding, when the pitch of the conductor poles is made narrow.

Crosstalk noise is greatly reduced in the present integrated circuit package because the holes 2b receive insulating layers 7 intermediate to the metallized layers 6 which form a portion of the walls of the holes 2b so that each conductor pole 3 has a perfectly shielded quasi-coaxial structure. The present invention achieves characteristic impedance matching of the conductor poles 3 to reduce the signal reflection noise and achieves an integrated circuit package 1 having improved signal transmission characteristics.

In addition, because the shielding effect persists when the pitch of the conductor poles is made narrow, the present integrated circuit package has a high density of conductor poles, and is small and lightweight.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is;

1. An integrated circuit package comprising;
   an insulating substrate having a laminated structure including a plurality of insulating plates, said substrate defining a plurality of holes for receiving conductor poles;
   metallized layers configured to shield said conductor poles from each other, said metallized layers being on said insulting plates; and
   insulating layers for insulating said metallized layers from said conductor poles, said insulating layers being located to be between said metallized layers and said conductor poles.

2. The integrated circuit package of claim 1, wherein said metallized layers are formed by screen printing processes.

3. The integrated circuit package of claim 2, wherein said metallized layers are electrically connected to each other.

4. The integrated circuit package of claim 1, wherein said metallized layers are on a surface of each of said insulating plates.

5. The integrated circuit package of claim 4, wherein said metallized layers have a thickness of 10 to 30 $\mu m$.

6. The integrated circuit package of claim 1, wherein said conductor poles are formed by sputtering, plating or casting.

7. The integrated circuit package of claim 1, wherein said metallized layers define inner surfaces in the holes, and wherein said insulating layers are on the inner surfaces.

8. The integrated circuit package of claim 1, wherein said conductor poles are formed as pin members which are coated with said insulating layers.

9. The integrated circuit package of claim 6, wherein said conductor poles have a pitch of from about 0.20 mm to about 0.40 mm.

10. The integrated circuit package of claim 8, wherein said conductor poles have a pitch of from about 0.20 mm to about 0.40 mm.

11. The integrated circuit package of claim 7, wherein said insulating layers have a thickness of from about 2 $\mu$m to about 20 $\mu$m.

12. The integrated circuit package of claim 8, wherein said insulating layers have a thickness of from about 10 $\mu$m to about 20 $\mu$m.

13. An integrated circuit package comprising:
   an insulating substrate defining a plurality of holes, each hole having
   a metallized layer, and
   an insulating layer on the metallized layer.

14. The integrated circuit package of claim 13, wherein said metallized layers are electrically connected to each other through a conductor pole.

15. The integrated circuit package of claim 13, wherein said holes have a pitch of from about 0.02 mm to about 0.40 mm.

16. The integrated circuit package of claim 14, wherein said holes have a pitch of from about 0.20 mm to about 0.40 mm.

* * * * *